US009484198B1

United States Patent
Chang et al.

(10) Patent No.: US 9,484,198 B1
(45) Date of Patent: Nov. 1, 2016

(54) PHYSICAL VAPOR DEPOSITION OF AN ALUMINUM NITRIDE FILM

(71) Applicant: Ming Chi University of Technology, New Taipei (TW)

(72) Inventors: Chen-Te Chang, New Taipei (TW); Yung-Chin Yang, New Taipei (TW); Jyh-Wei Lee, New Taipei (TW)

(73) Assignee: Ming Chi University of Technology, New Taipei (TW)

( * ) Notice: Subject to any disclaimer, the term of this patent is extended or adjusted under 35 U.S.C. 154(b) by 0 days.

(21) Appl. No.: 14/687,474

(22) Filed: Apr. 15, 2015

Related U.S. Application Data

(60) Provisional application No. 61/984,427, filed on Apr. 25, 2014.

(51) Int. Cl.
*H01L 21/02* (2006.01)

(52) U.S. Cl.
CPC ..... *H01L 21/0254* (2013.01); *H01L 21/02381* (2013.01); *H01L 21/02422* (2013.01); *H01L 21/02631* (2013.01)

(58) Field of Classification Search
None
See application file for complete search history.

(56) References Cited

U.S. PATENT DOCUMENTS

| | | | | |
|---|---|---|---|---|
| 4,818,357 A * | 4/1989 | Case | ............ | C23C 14/06 136/249 |
| 8,389,313 B2 * | 3/2013 | Miki | ............ | C23C 16/303 257/82 |
| 2003/0109076 A1 * | 6/2003 | Senda | ............ | C23C 14/0036 438/46 |
| 2008/0303054 A1 * | 12/2008 | Yokoyama | ............ | C23C 14/0617 257/103 |
| 2011/0001163 A1 * | 1/2011 | Sasaki | ............ | H01L 33/12 257/103 |
| 2011/0163350 A1 * | 7/2011 | Yokoyama | ............ | C23C 14/0617 257/100 |

FOREIGN PATENT DOCUMENTS

| CN | 102122936 A | 7/2011 |
|---|---|---|
| TW | 201425631 A | 7/2014 |

* cited by examiner

*Primary Examiner* — Andres Munoz
(74) *Attorney, Agent, or Firm* — Osha Liang LLP

(57) ABSTRACT

A method for physical vapor deposition of an aluminum nitride film, comprising: positioning a substrate and an aluminum target in a chamber; vacuuming the chamber so that a chamber pressure is at a base pressure between $7.1 \times 10^{-7}$-$5 \times 10^{-6}$ torr; conducting a working gas composed of argon gas and nitrogen gas into the chamber so that the chamber pressure is at a working pressure between 3-7 mtorr; and depositing the aluminum nitride film on the substrate by applying a high power impulse power supply to the aluminum target and applying a direct current bias power supply to the substrate under the working pressure and a substrate temperature between room temperature (25° C.) to 200° C.; wherein a power of the high power impulse power supply is between 500-600 W and a frequency thereof is between 750-1250 Hz, and a bias of the direct current bias power supply is between −50-0 V.

10 Claims, 2 Drawing Sheets

PHYSICAL VAPOR DEPOSITION OF AN ALUMINUM NITRIDE FILM

CROSS REFERENCE

This non-provisional application claims priority of American Provisional Application No. 61/984,427, filed on Apr. 25, 2014, the content thereof is incorporated by reference herein.

FIELD OF THE INVENTION

The present invention relates to a method for deposition of an aluminum nitride film, and more particularly to a method for physical vapor deposition of an aluminum nitride film.

BACKGROUND OF THE INVENTION

Aluminum nitride (AlN) is a III/V group semiconductor compound and a ceramic material. Aluminum nitride has a hexagonal wurtzite structure, and its nitrogen atom and aluminum atom are covalently linked to form a tetrahedral structure. The energy gap of aluminum nitride is about 6.2 eV, the highest in all III/V group semiconductor compounds, and this compound is of transmittance, high thermal conductivity, high hardness, thermal resistance, chemical resistance, piezoelectricity, and biocompatibility. Since aluminum nitride has a thermal expansion coefficient approximate to that of silicon, the compound is suitable for a chip package. Accordingly, aluminum nitride is mostly used as a heat sink, an electronic ceramic substrate, a material for an electronic element package, and a surface acoustic wave device.

Current deposition of an aluminum nitride film is conducted via chemical vapor deposition (CVD) or physical vapor deposition (PVD), and the latter is further subdivided into molecular beam epitaxy (MBE), medium frequency magnetron sputtering, and direct current/radio frequency magnetron sputtering. Although physical vapor deposition of an aluminum nitride film is popular and rapid, it is implemented at a high temperature. This results in limiting the selection of a substrate for deposition so as to influence the subsequent application of the film. For example, in the physical vapor deposition described in Taiwan Patent Application NO. 201425631, an aluminum nitride film is formed on a substrate at 400° C. For further example, in the physical vapor deposition described in China Patent Application NO. 102122936, an aluminum nitride film is deposited on a substrate at 830-900° C.

Therefore, there is a need to develop a novel method for physical vapor deposition of an aluminum nitride film, and the method can be implemented at a low temperature to improve the selection of a substrate for deposition.

SUMMARY OF THE INVENTION

An objective of the present invention is to provide a method for physical vapor deposition of an aluminum nitride film, which can be performed at a low temperature to vary the selection of a substrate.

To achieve the foregoing and/or other objective(s), the present invention discloses a method for physical vapor deposition of an aluminum nitride film. The method comprises the following steps of: positioning a substrate and an aluminum target in a chamber; vacuuming the chamber so that a chamber pressure is at a base pressure between $7.1 \times 10^{-7}$-$5 \times 10^{-6}$ torr; conducting a working gas composed of argon gas and nitrogen gas into the chamber so that the chamber pressure is at a working pressure between 3-7 mtorr; and depositing the aluminum nitride film on the substrate by applying a high power impulse power supply to the aluminum target and applying a direct current bias power supply to the substrate under the working pressure and a substrate temperature between room temperature (25° C.) to 200° C., wherein a power of the high power impulse power supply is between 500-600 W and a frequency thereof is between 750-1250 Hz, and a bias of the direct current bias power supply is between −50-0 V.

In an embodiment of the present invention, an on time of the high power impulse power supply is between 20-50 μs, and an off time thereof is between 772-1299 μs.

In an embodiment of the present invention, a duty cycle of the high power impulse power supply is between 2.5%-5%.

In an embodiment of the present invention, the argon gas is conducted at a flow rate between 10-25 sccm, and the nitrogen gas is conducted at a flow rate between 10-20 sccm.

In an embodiment of the present invention, a total time in the depositing step is between 60-120 min.

In an embodiment of the present invention, a rotational speed of the substrate relative to the chamber is between 15-25 rpm.

In an embodiment of the present invention, a hardness of the aluminum nitride film is between 15.6-28 GPa.

In an embodiment of the present invention, a visible transmittance of the aluminum nitride film is between 67.6%-82.5%.

In an embodiment of the present invention, the substrate is a silicon substrate, a plastic substrate, a glass substrate, or a flexible and soft substrate.

In the present method, the aluminum nitride film is formed on the substrate at a low temperature. As such, the selection of the substrate can be varied. Furthermore, the aluminum nitride film is a film of high hardness and/or high visible transmittance in certain embodiments.

DETAILED DESCRIPTION OF THE INVENTION

Figure 1:
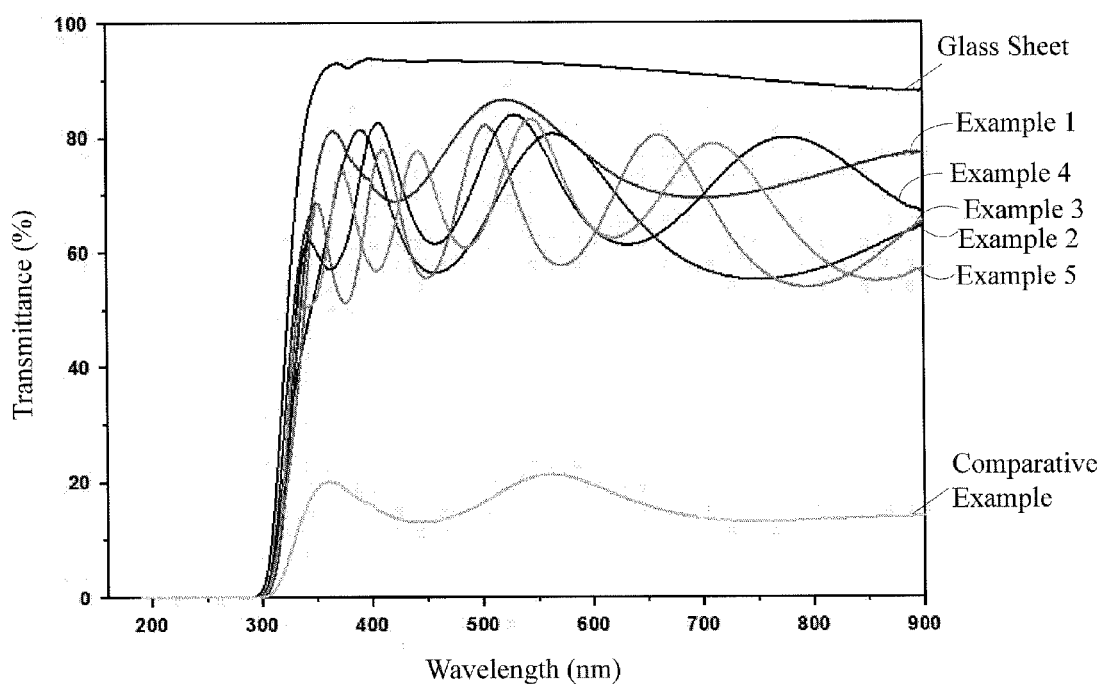
FIG. 1 is a graph illustrating the transmittance of the aluminum nitride films in Examples 1-5 and Comparative Example, and the glass sheet.

The detailed description and preferred embodiments of the invention will be set forth in the following content, and provided for people skilled in the art so as to understand the characteristic of the invention.

Example 1

A (100) P-type monocrystalline silicon substrate or a glass substrate was dipped in ethanol, and cleaned for 15 min under ultrasonication. After being removed from the ethanol, the substrate was dried by a nitrogen gas blow. The dried substrate was placed in a sample holder, and then the sample holder was placed in a chamber with an aluminum target. After which, the chamber was vacuumed so that its pressure was at 1.4×10-6 torr (the pressure herein is called "base pressure"). The substrate was heated at 200° C. (the temperature herein is called "substrate temperature"), and argon gas was conducted to the chamber at a flow rate of 80 sccm to make the chamber pressure at 100 mtorr (the pressure herein is called "etching pressure"). After that, under the substrate temperature and the etching pressure, a direct power supply with −350 V bias was applied to the substrate to etch the substrate for 15 min.

After the substrate etching process, an impulse power supply with 500 W power was applied to the aluminum target to pre-sputter the target for 20 min. Afterward, a working gas composed of argon gas at a 10 sccm flow rate and nitrogen gas at a 20 sccm flow rate was conducted into the chamber to let the chamber pressure be at 5 mtorr (the pressure herein is called "working pressure"). Under the working pressure, the substrate temperature, and a 20 rpm rotational speed of the substrate relative to the chamber, a high power impulse power supply with 600 W power, 1000 Hz frequency, 50/950 µs/µs on/off time, and 5% duty cycle was applied to the aluminum target, and a direct current bias power supply with −30 V bias was applied to the substrate to deposit an aluminum nitride film on the substrate for 60 min. Finally, when these supplies were turned off and the substrate was cooled to room temperature, the aluminum nitride film on the substrate was taken out of the chamber.

Examples 2-14

The aluminum nitride films in Examples 2-14 were manufactured following the procedure described in Example 1, except for the deposition conditions listed in Table 1 below.

Comparative Example

The aluminum nitride film in Comparative Example was manufactured following the procedure described in Example 1, except for the deposition conditions listed in Table 1 below.

Hardness Analysis

A nano-indentation system (TI-900 TriboIndenter, Hysitron, America) was used to measure the hardness of the films in Examples 1-14 and Comparative Example. During the measurement, a Berkovich probe tip was loaded on each film according to the Oliver and Pharr method (J. Mater. Res. 7, 1564 (1992)), and the tip was made of diamond and had an equivalent cone angle of 142.3 degree. Also, the maximum loading weight was of 5 mN, and the loading rate was of 1000 N/s. The result of the hardness measurement is listed in Table 2 below. Note that the films in Examples 1-14 are harder than that in Comparative Example.

Transmittance Analysis

Figure 2:
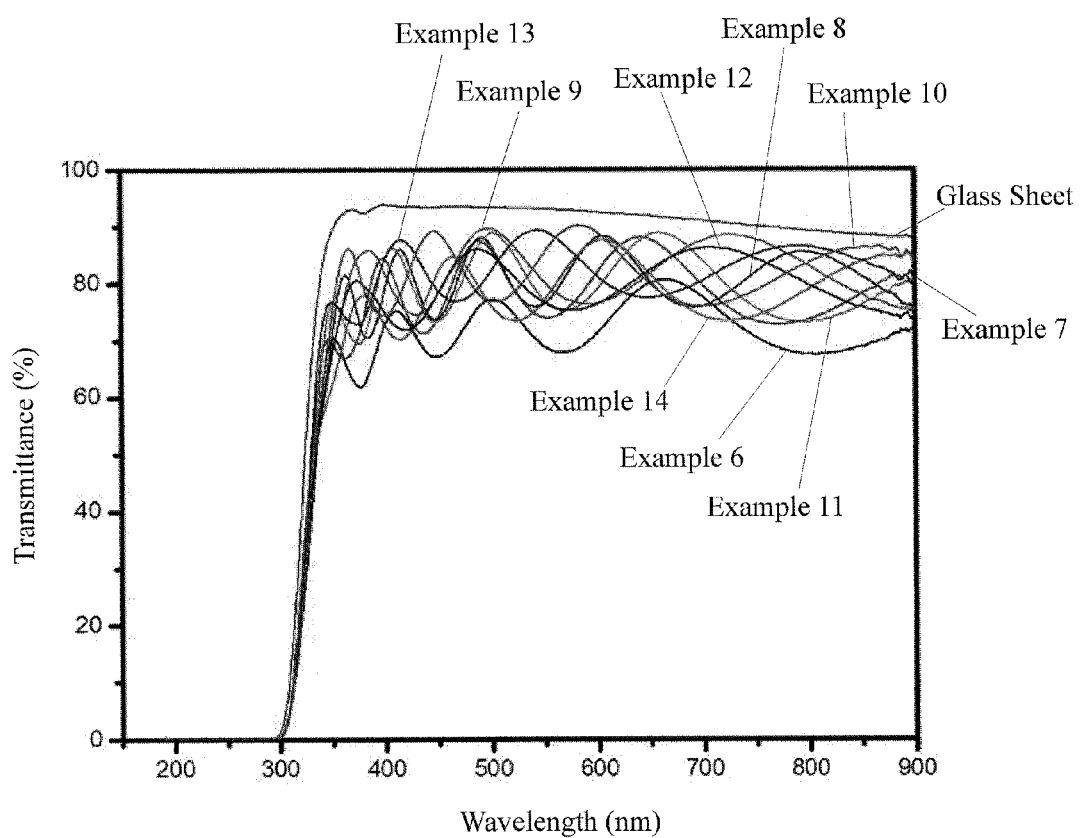
FIG. 2 is a graph illustrating the transmittance of the aluminum nitride films in Examples 6-14, and the glass sheet.

A UV-vis spectrophotometer was introduced to analyze the transmittances of the foregoing films and a glass sheet. The result of the transmittance measurement is shown in FIGS. 1-2 and Table 2 below. According to the result, the visible transmittances (wavelength: 400-700 nm) of the films in Examples 1-14 are greater than that of the film in Comparative Example, but less than that of the glass sheet.

TABLE 2

Hardness and visible transmittance of the films in Examples 1-14 and Comparative Example, and the glass sheet

|  | hardness (GPa) | visible transmittance (%) |
| --- | --- | --- |
| Example 1 | 20.4 | 76.4 |
| Example 2 | 21.5 | 67.6 |
| Example 3 | 28 | 69.2 |
| Example 4 | 27 | 69.9 |
| Example 5 | 26.5 | 69.5 |
| Example 6 | 24.9 | 73.6 |
| Example 7 | 21.1 | 80.7 |
| Example 8 | 15.6 | 81.1 |
| Example 9 | 18 | 81.4 |
| Example 10 | 24.1 | 79.4 |
| Example 11 | 24.7 | 82.1 |
| Example 12 | 18.3 | 79.6 |
| Example 13 | 16 | 82.1 |
| Example 14 | 18 | 82.5 |

TABLE 1

Conditions for depositing the films in Examples 1-14, and Comparative Example

| Example | high power impulse power supply | | | | | working gas | | bias of | substrate | | |
| --- | --- | --- | --- | --- | --- | --- | --- | --- | --- | --- | --- |
| | Power (W) | Frequency (Hz) | on/off time (µs/µs) | duty cycle (%) | base pressure (torr) | working pressure (mtorr) | argon gas (sccm) | nitrogen gas (sccm) | direct current bias power supply (V) | Temperature (° C.) | rotational speed (rpm) | deposition time (min) |
| 1 | 600 | 1000 | 50/950 | 5 | $1.4 \times 10^{-6}$ | 5 | 10 | 20 | −30 | 200 | 20 | 60 |
| 2 | 600 | 1000 | 40/960 | 4 | $5 \times 10^{-6}$ | 5 | 10 | 20 | −30 | 200 | 20 | 75 |
| 3 | 600 | 1000 | 35/965 | 3.5 | $5 \times 10^{-6}$ | 5 | 10 | 20 | −30 | 200 | 20 | 120 |
| 4 | 600 | 1250 | 28/772 | 3.5 | $5 \times 10^{-6}$ | 5 | 10 | 20 | −30 | 200 | 20 | 120 |
| 5 | 600 | 833 | 42/1158 | 3.5 | $7.1 \times 10^{-7}$ | 5 | 10 | 20 | −30 | 200 | 20 | 120 |
| 6 | 500 | 750 | 34/1299 | 2.6 | $5 \times 10^{-6}$ | 5 | 25 | 10 | −50 | room temperature | 20 | 120 |
| 7 | 500 | 750 | 40/1293 | 3 | $5 \times 10^{-6}$ | 5 | 25 | 10 | −30 | 100 | 20 | 120 |
| 8 | 500 | 750 | 47/1286 | 3.5 | $5 \times 10^{-6}$ | 5 | 25 | 10 | 0 | 200 | 20 | 120 |
| 9 | 500 | 1000 | 25/975 | 2.53 | $5 \times 10^{-6}$ | 5 | 25 | 10 | 0 | 100 | 20 | 120 |
| 10 | 500 | 1000 | 30/970 | 3 | $5 \times 10^{-6}$ | 5 | 25 | 10 | −50 | 200 | 20 | 120 |
| 11 | 500 | 1000 | 35/965 | 3.5 | $5 \times 10^{-6}$ | 5 | 25 | 10 | −30 | room temperature | 20 | 120 |
| 12 | 500 | 1250 | 20/780 | 2.5 | $5 \times 10^{-6}$ | 5 | 25 | 10 | −30 | 200 | 20 | 120 |
| 13 | 500 | 1250 | 24/776 | 3 | $5 \times 10^{-6}$ | 5 | 25 | 10 | 0 | room temperature | 20 | 120 |
| 14 | 500 | 1250 | 28/772 | 3.5 | $5 \times 10^{-6}$ | 5 | 25 | 10 | −50 | 100 | 20 | 120 |
| Comparative | 600 | 1000 | 35/965 | 3.5 | $5 \times 10^{-6}$ | 5 | 10 | 20 | 150 | 200 | 0 | 120 |

TABLE 2-continued

Hardness and visible transmittance of the films in Examples 1-14 and Comparative Example, and the glass sheet

|  | hardness (GPa) | visible transmittance (%) |
|---|---|---|
| Comparative Example | 9.4 | 16.7 |
| Glass sheet | — | 92.7 |

As shown above, the method of the present invention is proven to be implemented at a low temperature. Therefore, the selection of the substrate is varied. In addition, the product in the method is also proven to likely be hard and visibly transparent.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for physical vapor deposition of an aluminum nitride film, comprising:
   positioning a substrate and an aluminum target in a chamber;
   vacuuming the chamber so that a chamber pressure is at a base pressure between $7.1\times10^{-7}$-$5\times10^{-6}$ torr;
   conducting a working gas composed of argon gas and nitrogen gas into the chamber so that the chamber pressure is at a working pressure between 3-7 mtorr; and
   depositing the aluminum nitride film on the substrate by applying a high power impulse power supply to the aluminum target and applying a direct current bias power supply to the substrate under the working pressure and a substrate temperature between room temperature (25° C.) to 200° C.;
   wherein a power of the high power impulse power supply is between 500-600 W and a frequency thereof is between 750-1250 Hz, and a bias of the direct current bias power supply is between −50-0 V.

2. The method as claimed in claim 1, wherein an on time of the high power impulse power supply is between 20-50 μs, and an off time thereof is between 772-1299 μs.

3. The method as claimed in claim 1, wherein a duty cycle of the high power impulse power supply is between 2.5%-5%.

4. The method as claimed in claim 1, wherein the argon gas is conducted at a flow rate between 10-25 sccm, and the nitrogen gas is conducted at a flow rate between 10-20 sccm.

5. The method as claimed in claim 1, wherein a total time in the depositing step is between 60-120 min.

6. The method as claimed in claim 1, wherein a rotational speed of the substrate relative to the chamber is between 15-25 rpm.

7. The method as claimed in claim 1, wherein a hardness of the aluminum nitride film is between 15.6-28 GPa.

8. The method as claimed in claim 1, wherein a visible transmittance of the aluminum nitride film is between 67.6%-82.5%.

9. The method as claimed in claim 1, wherein the substrate is a silicon substrate, a plastic substrate, a glass substrate, or a flexible and soft substrate.

10. The method as claimed in claim 1, wherein a hardness of the aluminum nitride film is between 15.6-28 GPa, and a visible transmittance thereof is between 67.6%-82.5%.

* * * * *